(12) United States Patent
Wolstenholme et al.

(10) Patent No.: US 7,563,679 B2
(45) Date of Patent: *Jul. 21, 2009

(54) REDUCTION OF FIELD EDGE THINNING IN PERIPHERAL DEVICES

(75) Inventors: Graham R. Wolstenholme, Boise, ID (US); Mark A. Helm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/880,003

(22) Filed: Jul. 18, 2007

(65) Prior Publication Data

US 2007/0264784 A1 Nov. 15, 2007

Related U.S. Application Data

(60) Continuation of application No. 11/233,569, filed on Sep. 23, 2005, now Pat. No. 7,262,102, which is a division of application No. 10/180,415, filed on Jun. 24, 2002, now Pat. No. 7,241,662.

(51) Int. Cl.
*H01L 21/475* (2006.01)

(52) U.S. Cl. .......................... 438/275; 438/424; 438/981

(58) Field of Classification Search .................. 438/221
See application file for complete search history.

(56) References Cited

U.S. PATENT DOCUMENTS

| | | | |
|---|---|---|---|
| 4,743,563 A | 5/1988 | Pfiester et al. | |
| 4,907,049 A | 3/1990 | Slotboom | |
| 5,502,009 A | 3/1996 | Lin | |
| 6,114,203 A | 9/2000 | Ghidini et al. | |
| 6,130,805 A * | 10/2000 | Sasaki et al. | 360/125.52 |
| 6,162,683 A | 12/2000 | Chen | |
| 6,225,167 B1 | 5/2001 | Yu et al. | |
| 6,235,591 B1 | 5/2001 | Balasubramanian et al. | |
| 6,380,020 B1 | 4/2002 | Shimizu | |
| 6,436,771 B1 * | 8/2002 | Jang et al. | 438/275 |
| 6,461,915 B1 | 10/2002 | Rudeck | |
| 6,468,099 B2 | 10/2002 | Kim | |
| 6,562,683 B1 | 5/2003 | Wang et al. | |
| 6,569,742 B1 | 5/2003 | Taniguchi et al. | |
| 7,132,330 B2 | 11/2006 | Kobayashi | |

(Continued)

FOREIGN PATENT DOCUMENTS

JP 2000349164 12/2000

*Primary Examiner*—Stephen W Smoot
(74) *Attorney, Agent, or Firm*—Ropes & Gray LLP

(57) ABSTRACT

A dielectric layer (e.g., an interpoly dielectric layer) is deposited over low and high voltage devices of a peripheral memory device. The dielectric behaves as an oxidation and wet oxide etch barrier. The dielectric prevents the devices from being stripped by a wet oxide etch that can result in the exposure of the silicon corners. The exposure of a silicon corner may increase thinning of a gate oxide at the field edge. This causes variability and unreliability in the device. The dielectric is not removed from a device until the device is ready for processing. That is, the dielectric remains on a device until the growing of a gate oxide on that device has begun. This reduces the exposure of the silicon corner. Hedges that result may be removed by exposing a trench in the field oxide at the hedge.

22 Claims, 10 Drawing Sheets

U.S. PATENT DOCUMENTS 7,241,662 B2 * 7/2007 Wolstenholme et al. ..... 438/275
7,262,102 B2 * 8/2007 Wolstenholme et al. ..... 438/275

2002/0096783 A1   7/2002   Shen et al.

* cited by examiner

REDUCTION OF FIELD EDGE THINNING IN PERIPHERAL DEVICES

This application is a continuation of U.S. patent application Ser. No. 11/233,569, filed Sep. 23, 2005 (now U.S. Pat. No. 7,262,102) which is a division of U.S. patent application Ser. No. 10/180,415, filed Jun. 24, 2002 (now U.S. Pat. No. 7,241,662) each of which is hereby incorporated by reference in its entirety.

BACKGROUND OF THE INVENTION

This invention relates to reducing gate oxide thinning at the field edge of complimentary metal oxide semiconductor (CMOS) devices and, more particularly, to reducing field edge thinning in peripheral devices.

Some CMOS devices are fabricated in such a way that a thin gate oxide and a thick gate oxide are grown on the device. In some processes for fabricating these peripheral CMOS devices, the thin gate oxide devices are sometimes stripped with a wet oxide etch prior to gate oxidation. In other processes, the thick gate oxide devices are sometimes stripped with a wet oxide etch prior to gate oxidation. When a device is stripped with a wet oxide etch, the silicon corners at the field edges may be exposed. This results in increased gate oxide thinning at the field edges (e.g., at the exposed corners). This increased thinning may lead to undesirable variability in the electrical parameters of the peripheral devices.

For example, the increased thinning at the field edges may cause a MOSFET (metal oxide semiconductor field effect transistor) to break down at the corners due to the non-uniformity of the gate oxide. This results in what is sometimes called a threshold kink. That is, a MOSFET may turn on closer to the device's field edges before the rest of the device turns on. When enough voltage is applied to the rest of the gate, the rest of the device may turn on. In essence, this results in two devices in parallel. This variability and other factors may lead to degradation in functionality, yield, and reliability in these devices.

It would therefore be desirable to be able to provide fabrication processes that reduce field edge thinning in peripheral devices.

SUMMARY OF THE INVENTION

It is an object of this invention to provide fabrication processes that reduce field edge thinning in peripheral devices.

Some peripheral devices (e.g., CMOS) include a low voltage device and a high voltage device separated by a field oxide or isolation dielectric. Field oxides or isolation dielectrics may also separate these peripheral devices from other devices. The invention is directed to the fabrication of these low and high voltage devices.

Low voltage and high voltage devices are typically fabricated in silicon. The field oxide may be a dielectric such as silicon dioxide. The fabrication processes of the invention eliminate a wet oxide etch used in other fabrication processes. Eliminating the wet oxide etch reduces the exposure of the silicon corners of the peripheral devices at their field edges. Reducing the exposure of the silicon corners results in more uniform gate oxides for such devices. More uniform gate oxides leads to less variable and more reliable devices.

The invention uses a dielectric layer as an oxidation and wet oxide etch barrier to prevent exposure of the silicon corners of the thick and thin gate oxide devices. Thinning of the gate oxides at the field edges is therefore reduced. The dielectric layer may be an interpoly dielectric layer, which may be, for example, an oxide-nitride-oxide.

The dielectric layer is deposited on both the low voltage and high voltage devices of a peripheral device. The low voltage device will ultimately have a thin gate oxide grown over it, while the high voltage device will ultimately have a thick gate oxide grown over it. Generally, the dielectric layer is not removed from a low or high voltage device until that device is ready to be processed. That is, the dielectric layer remains on a device until the process of growing a gate oxide on the device has begun. Masks may be deposited on or placed over the device to selectively etch dielectric layers.

A portion of the thick gate oxide may be grown on a high voltage device before the thin gate oxide is grown on a low voltage device. That is, the gate oxide for the high voltage device may be the thick gate oxide grown over the high voltage device and an additional layer of oxide grown over the device (e.g., a thin layer of oxide grown over the low and high voltage devices—the thin layer of oxide grown over the low voltage device may be the gate oxide for that device). In other words, the thin gate oxide is grown directly over the thick gate oxide. The thin and thick gate oxides grown over the high voltage device will be the gate oxide for that device.

When masks are not lined up exactly with the dielectric layers they are intended to cover, a small portion of the dielectric layer may not be removed from the device when oxides are grown. These small portions are sometimes referred to as hedges. Hedges may be removed by exposing a trench in the field oxide near the hedge. Field oxides may be locally exposed by depositing or placing a mask with openings or windows on or over the device. The field oxide is then etched at the hedges which will in turn remove the hedges.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention is directed to the fabrication of peripheral devices. Peripheral devices may be used to implement storage cells in memory devices such as, for example, SRAMs, DRAMs, and memory devices used in flash applications.

In the fabrication of some peripheral memory devices, a dielectric layer is deposited over the peripheral devices and the memory devices to which the peripheral devices are coupled. The dielectric layer may be an interpoly dielectric layer. Such an interpoly dielectric layer may be, for example, oxide-nitride-oxide or aluminum-oxide. The dielectric is used as an oxidation and wet-oxide etch barrier. In some peripheral device fabrication, the dielectric layer is removed from the entire peripheral device but not the memory device. The dielectric layer is removed from the peripheral device to allow thin and thick gate oxides to be grown over the peripheral device. That is, the low and high voltage devices are exposed before the growth of the thin and thick gate oxides.

In processes such as these, one device may be stripped more times with a wet oxide etch prior to gate oxidation than the other device (e.g., a low voltage device compared to a high voltage device). This increases exposure of the silicon corners at the field edges resulting in increased gate oxide thinning at the field edges.

FIGS. 1-6 and 8-20 show peripheral devices having sources and drains perpendicular to face of the page.

FIGS. 1-6 illustrate a process of fabricating complimentary metal oxide semiconductor (CMOS) field effect transistor (FET) peripheral devices. As illustrated in FIGS. 1-6, a thin gate oxide device (depicted on the left of the FIGS.) may see more wet oxide strips prior to gate oxidation than a thick gate oxide device (depicted on the right of the FIGS.). FIGS. 1-6 illustrate a process that results in the exposure of silicon corners in low voltage devices. Other processes may result in the exposure of silicon corners in high voltage devices.

Thin gate oxide devices and thick gate oxide devices are sometimes referred to as low voltage and high voltage devices, respectively. The thin and thick gate oxide devices are respectively referred to as such because of the amount of voltage required to turn the devices on. Hereinafter, "low voltage device" and "high voltage device" are used to refer to thin gate oxide and thick gate oxide devices, respectively.

Figure 1:
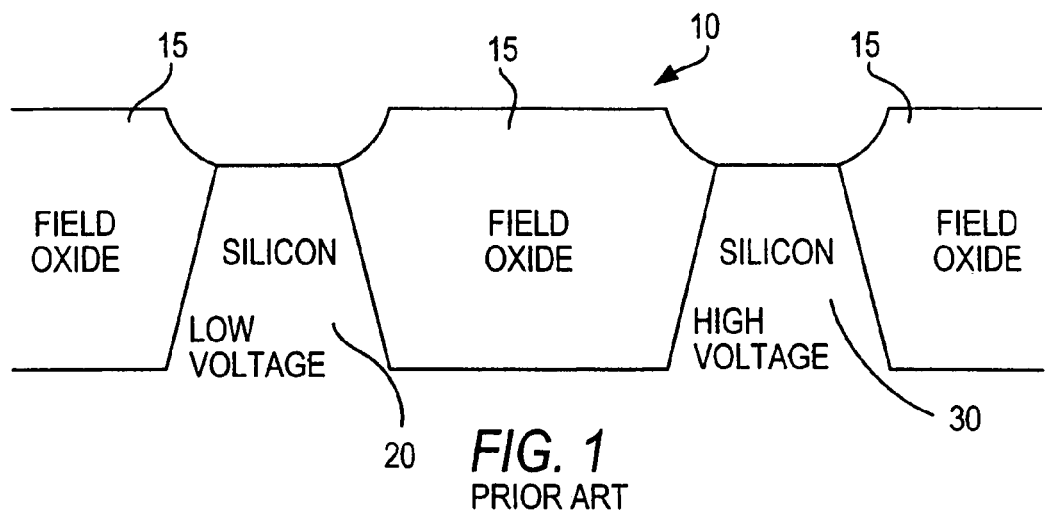
FIGS. 1-6 illustrate a fabrication process that may result in gate oxide thinning at field edges.

As mentioned above, a dielectric layer is sometimes deposited over a memory device as well as peripheral devices. FIG. 1 illustrates a peripheral device 10 with a dielectric layer removed from the entire device in order to grow thin and thick gate oxides over the low voltage device 20 and the high voltage device 30, respectively. The dielectric layer is not removed from the rest of the memory device (not shown) in order to protect the rest of the memory device from the processing of the peripheral devices. Devices 20 and 30 are preferably silicon devices. A field oxide 15 separates devices 20 and 30 from each other as well as from other devices. Field oxide 15 may be any suitable oxide such as silicon dioxide.

Figure 2:
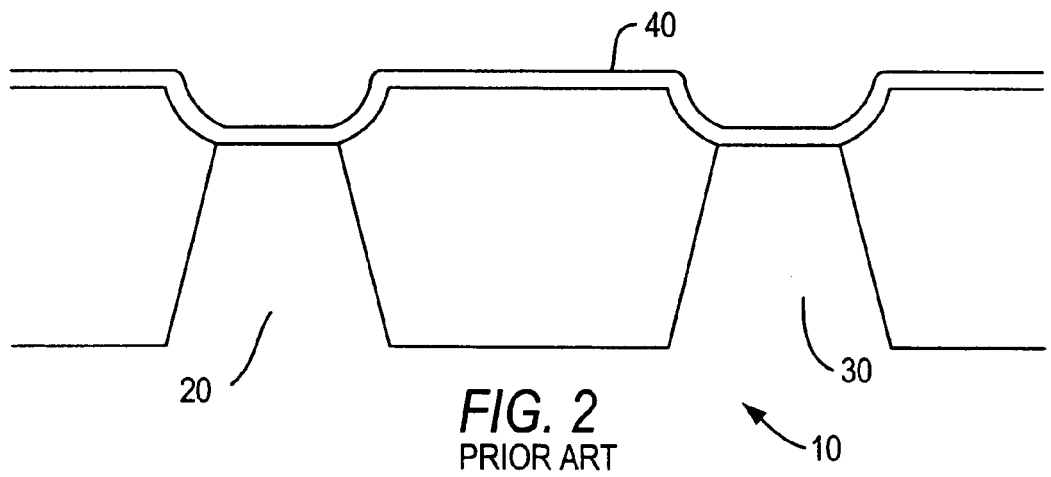
Figure 3:
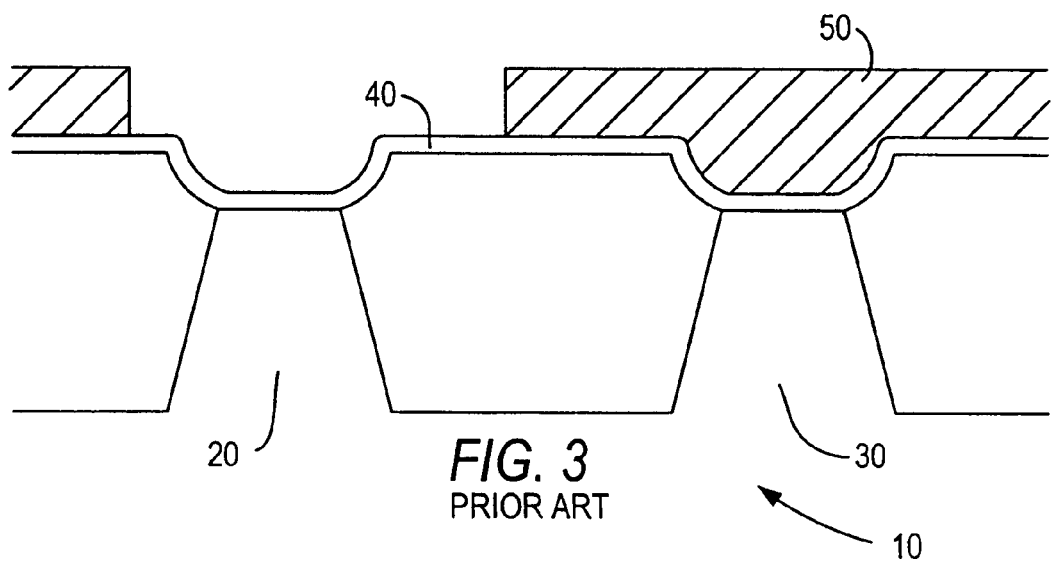
Figure 4:
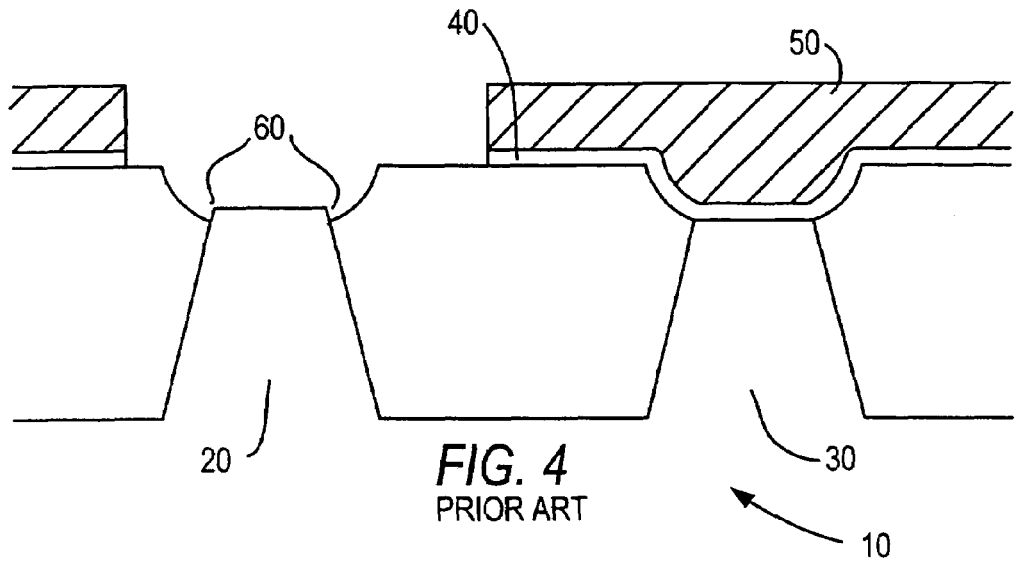
Figure 5:
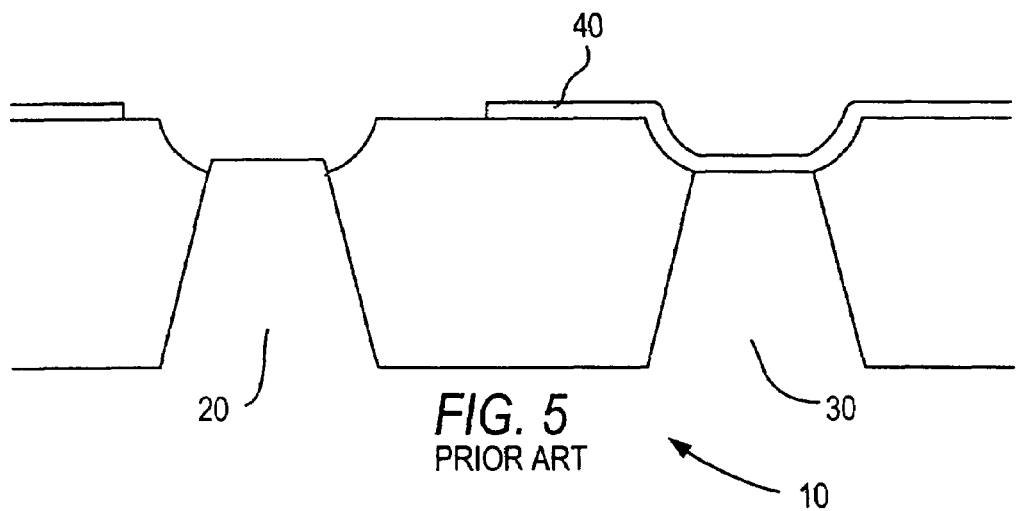
Figure 6:
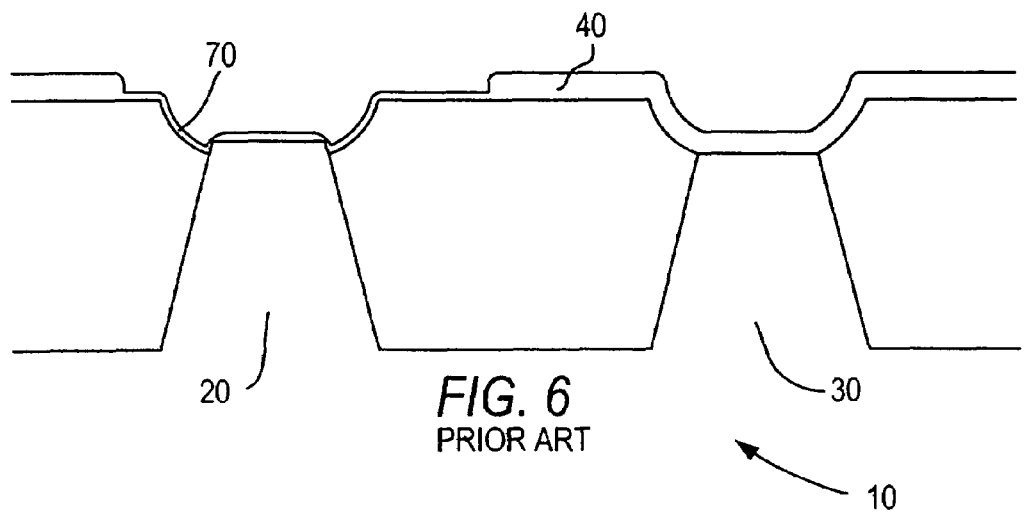

As shown in FIG. 2, an oxide layer 40 is grown over peripheral device 10 after the dielectric layer is removed. Oxide layer 40 will be part of the gate oxide for high voltage device 30. The remainder of the gate oxide for high voltage device 30 is grown when the gate oxide for low voltage device 20 is grown. After oxide layer 40 is grown, a mask 50 is laid over device 10 such that low voltage device 20 is not covered, as shown in FIG. 3. Mask 50 may be any suitable mask such as an implant mask. The portion of oxide layer 40 that is not covered by mask 50 is then stripped by a wet oxide etch, as shown in FIG. 4. This wet oxide etch increases the exposure of the silicon corners 60 at the field edges. Mask 50 is then removed, as shown in FIG. 5. Another oxide layer is then grown over devices 20 and 30, as shown in FIG. 6. Oxide layer 70 is grown directly over oxide layer 40. The oxide layers grown over high voltage device 30, (i.e., oxide layers 40 and 70) are the gate oxide for device 30. That is, the thickness of the gate oxide for device 30 is the sum of the thicknesses of oxide layer 40 and oxide layer 70. Oxide layer 70 is the gate oxide for low voltage device 20. In this example, oxide layer 70 is thinner than oxide layer 40. (None of the FIGS. are drawn to scale.)

Figure 7:
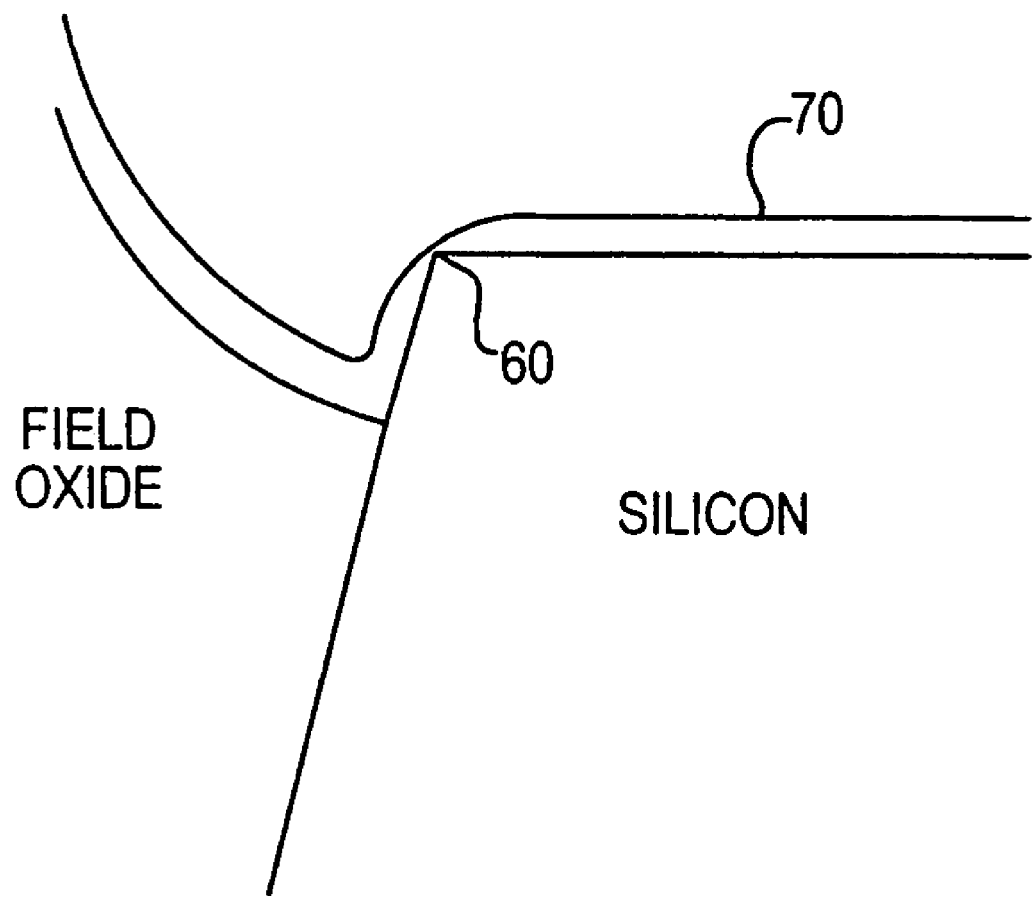
FIG. 7 illustrates gate oxide thinning at a field edge because of increased exposure of a silicon corner.

FIG. 6 illustrates the increased thinning of oxide layer 70 at the field edges because of the increased exposure of the silicon corners of low voltage device 20. FIG. 7 is a more detailed illustration of FIG. 6. As shown, oxide layer 70 is thinner at silicon corner 60 than at the rest of the device.

Although the processes of the invention relate primarily to the fabrication of CMOS peripheral devices, these processes may be used to reduce or prohibit gate oxide thinning at field edges in other devices such as, for example, capacitors, other types of field effect transistors, and other related MOS devices.

The fabrication processes in accordance with the invention reduce the increased gate oxide thinning at the field edge by, among other things, using a dielectric layer as an oxidation and wet oxide etch barrier for the low and high voltage devices.

FIGS. 8-17 illustrate an exemplary process of reducing the exposure of silicon corners and the increased gate oxide thinning at field edges. In FIGS. 8-17, a low voltage device 90 is shown on the left, and a high voltage device 100 is shown on the right.

Figure 8:
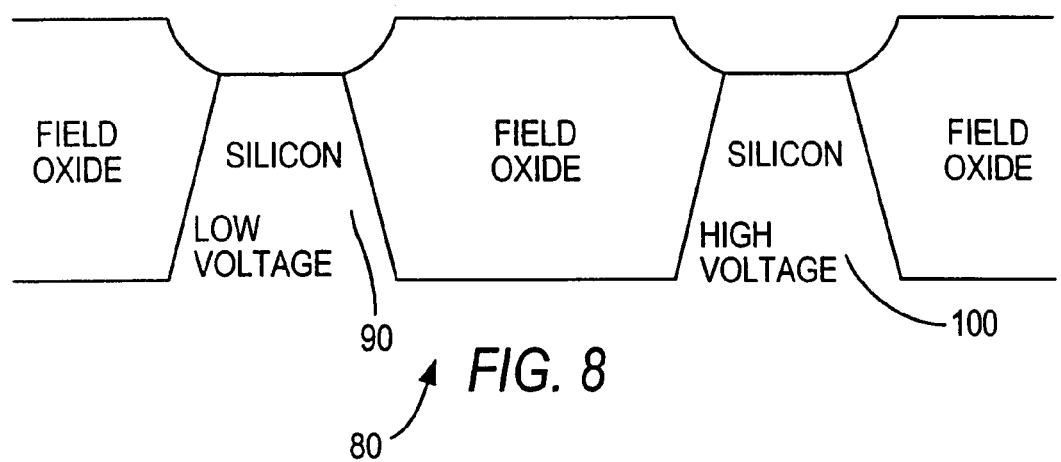
FIGS. 8-17 illustrate an embodiment of a fabrication process that reduces gate oxide thinning at field edges in accordance with the invention.
Figure 9:
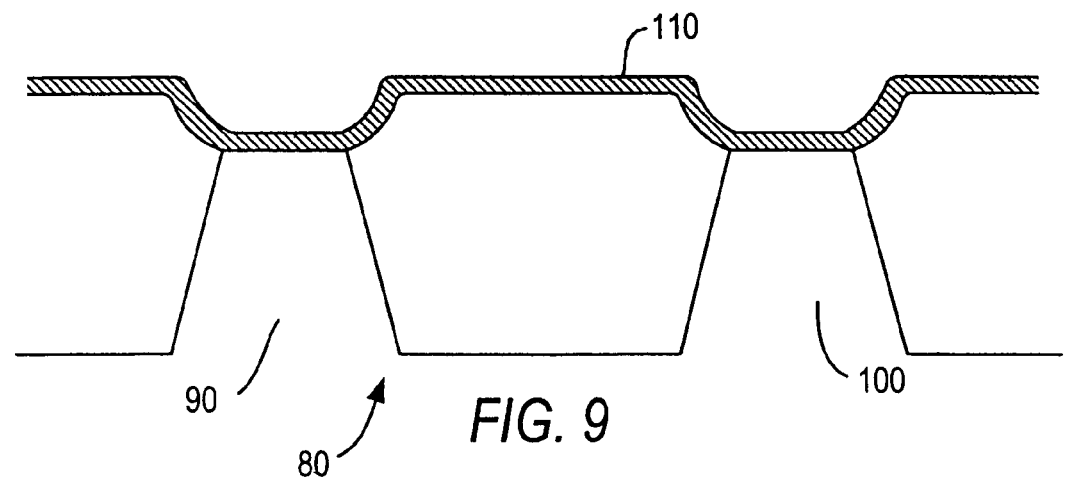

FIG. 8 illustrates a peripheral device 80 before gate oxides are grown on low voltage device 90 and high voltage device 100. As illustrated in FIG. 9, a dielectric layer 110 is deposited over devices 90 and 100. Dielectric layer 110 may be any suitable dielectric layer that behaves as an oxidation and wet oxide etch barrier. Such a dielectric layer may be an interpoly dielectric layer of, for example, oxide-nitride-oxide or aluminum-oxide. Dielectric layer 110 preferably has a thickness suitable to suppress oxidation and behave as a wet oxide etch barrier. For a dielectric layer 110 of oxide-nitride-oxide, such a thickness may be, for example, about 150 angstroms.

Figure 10:
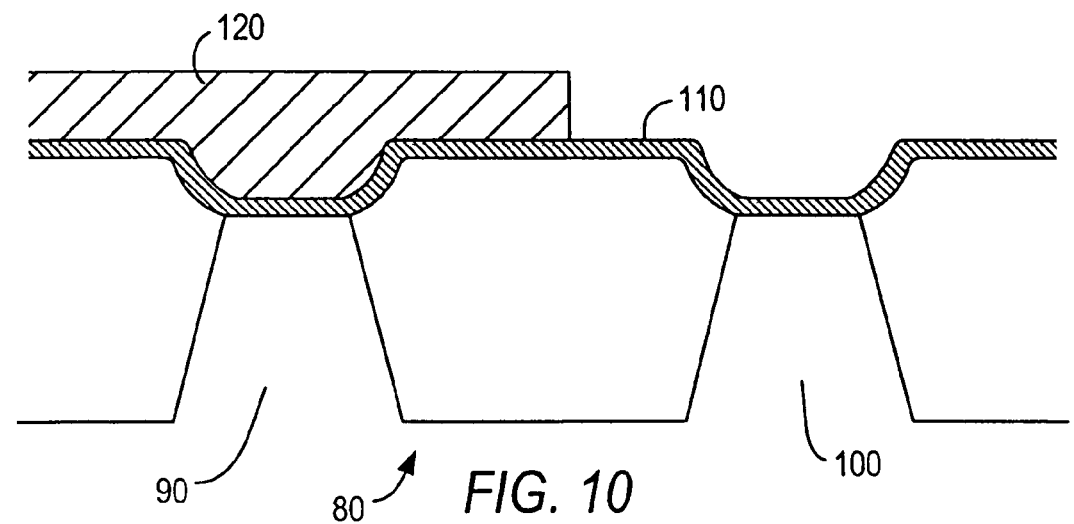
Figure 11:
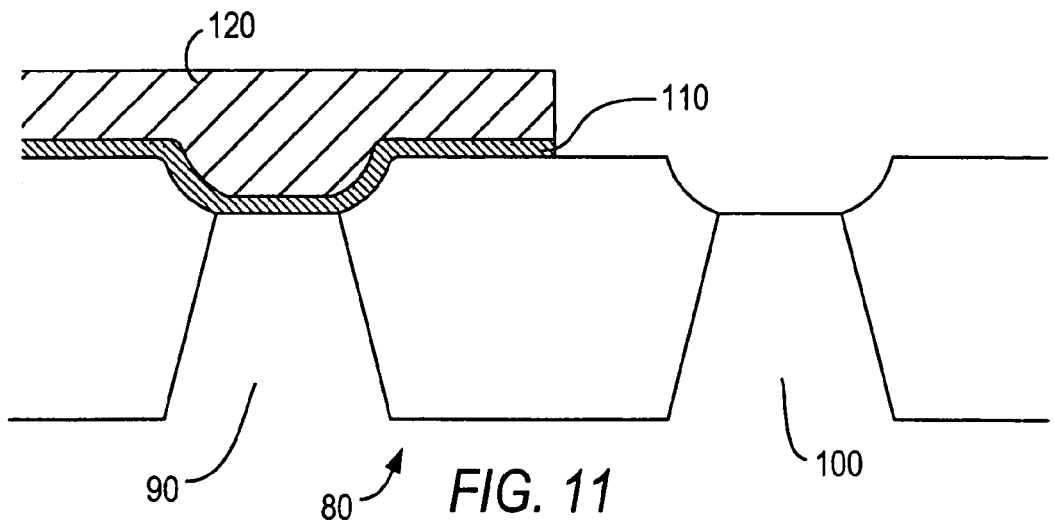

After dielectric layer 110 is deposited, a mask 120 is deposited on or placed over peripheral device 80 such that the portion of dielectric layer 110 covering high voltage device 100 can be removed, as shown in FIG. 10. As shown in FIG. 11, the exposed portion of dielectric layer 110 is removed. This removal may be accomplished by a dry etch, a wet etch, or a combination of a dry and wet etch. Generally, those portions of a dielectric layer that are covered by a mask (e.g., mask 120) are preferably not removed. That is, when a mask is deposited on or placed over portions of a dielectric layer, those portions are preferably not removed by, for example, a dry or wet etch.

As illustrated in FIGS. 10 and 11, mask 120 may be an implant mask. Alternatively, mask 120 may be any other suitable type of mask such that portions of dielectric layer 110 may be selectively removed and oxide layers (e.g., oxide layer 130) selectively grown. Mask 120 may be of any suitable material such as a photoresist.

Figure 12:
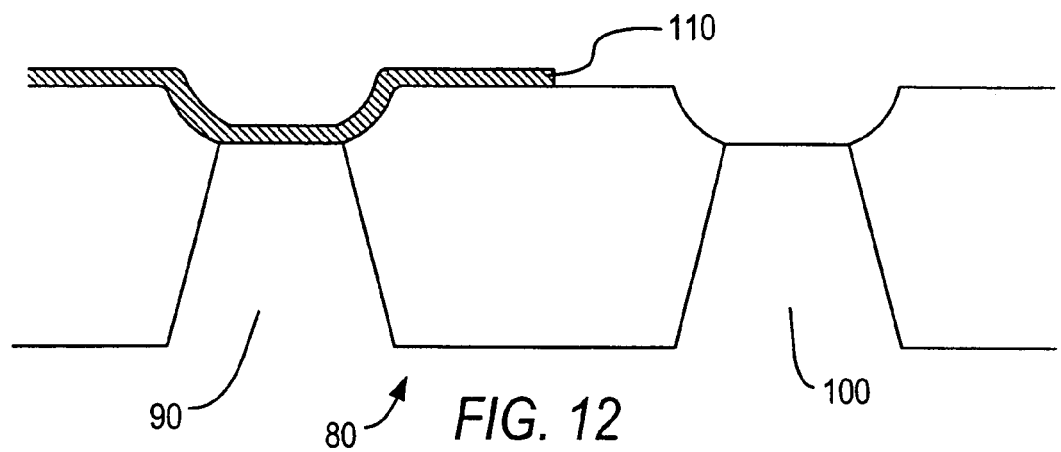
Figure 13:
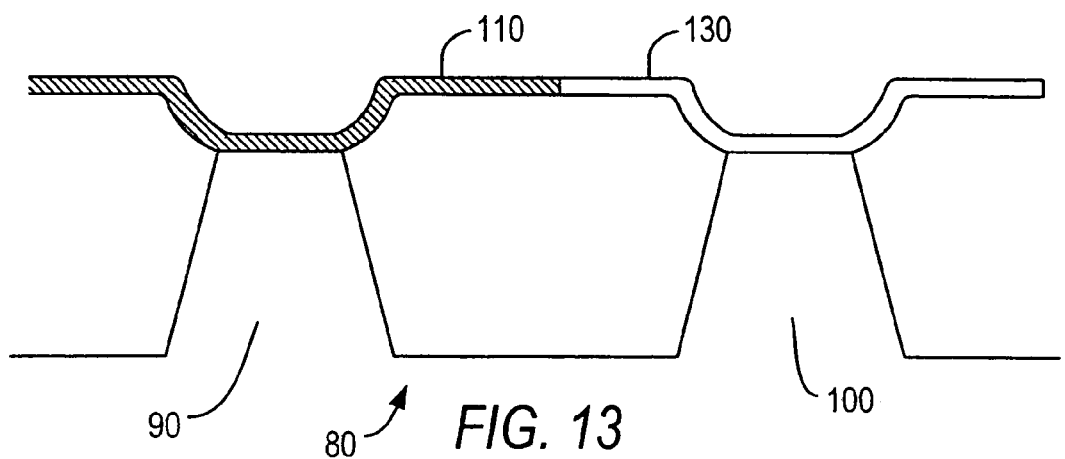

As illustrated in FIG. 12, mask 120 is removed after the exposed portion of dielectric layer 110 is removed. Oxide layer 130 is then grown over high voltage device 100, as shown in FIG. 13. The portion of dielectric layer 110 covering low voltage device 90 prevents the growth of any oxide over low voltage device 90.

Oxide layer 130 is preferably a portion of the total gate oxide for high voltage device 100. That is, the fabrication process may subsequently grow more oxide on top of oxide layer 130. Oxide layer 130 in conjunction with additional oxide may serve as the gate oxide for device 100.

Figure 14:
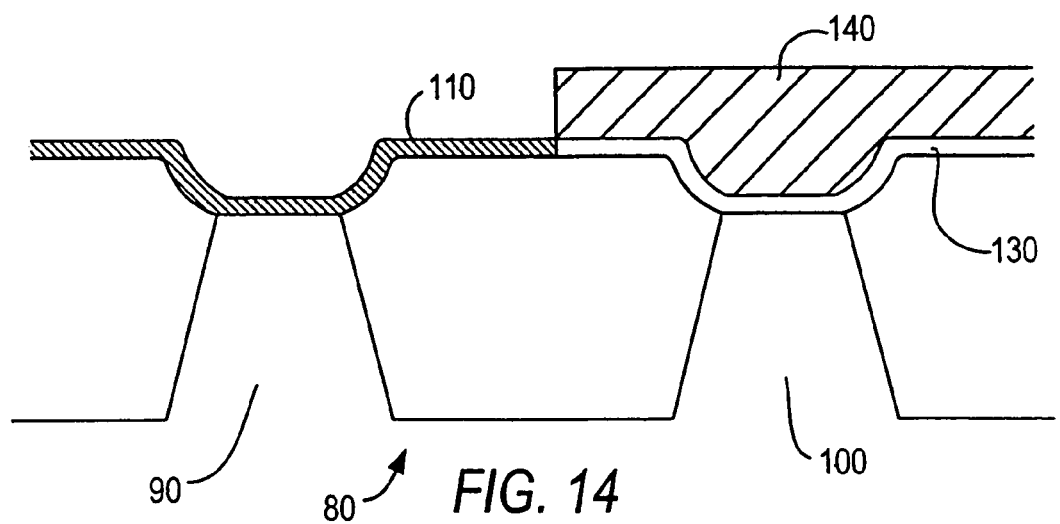

After oxide layer 130 is grown over high voltage device 100, a mask 140 is deposited on or placed over oxide layer 130, as shown in FIG. 14. The portion of dielectric layer 110 protecting low voltage device 90 is then removed, as shown in FIG. 15.

Figure 15:
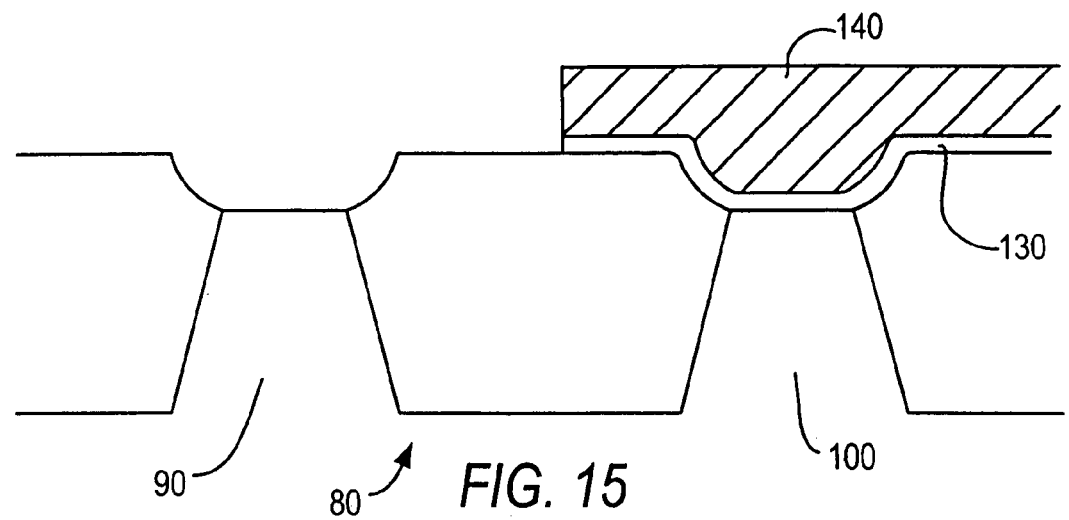

As illustrated in FIGS. 14 and 15, mask 140 may be an implant mask. Mask 140 alternatively may be any other suitable type of mask that permits portions of dielectric layer 110 to be selectively removed. Mask 140 may be of any suitable material such as a photoresist.

Figure 16:
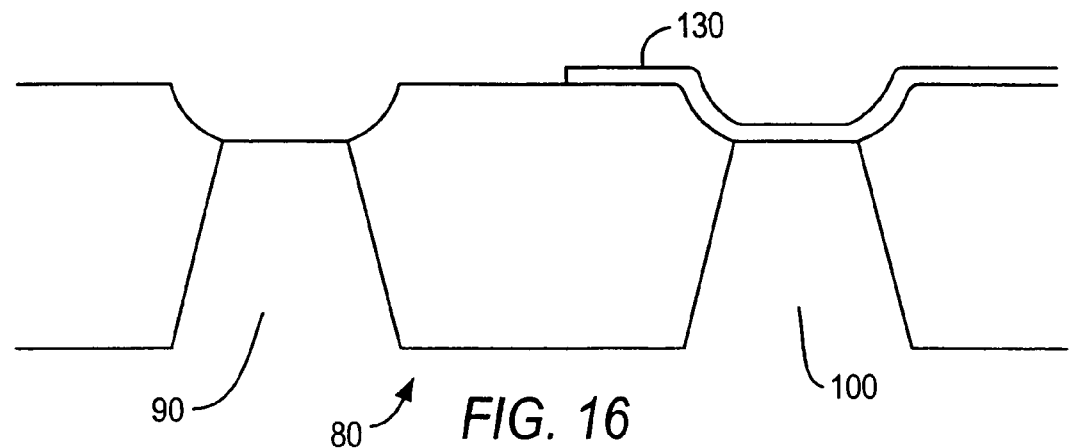
Figure 17:
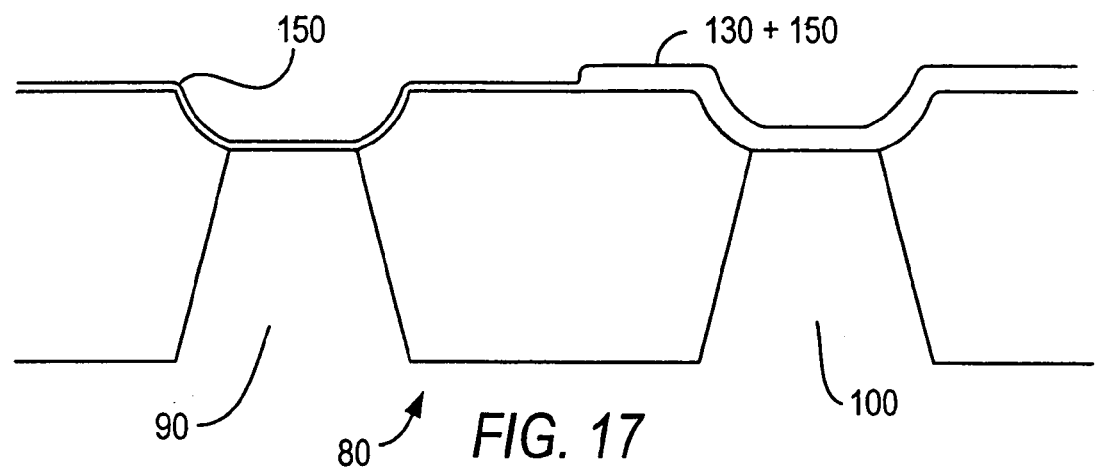

FIG. 16 shows mask 140 removed. Oxide layer 150 is then grown over low voltage device 90 and high voltage device 100. As illustrated in FIG. 17, oxide layer 150 may be grown directly over oxide layer 130. When oxide layer 150 is grown over oxide layer 130, less oxide will be grown over oxide layer 130 than over silicon. This occurs because the growth of oxide on silicon is greater than the growth of oxide on oxide. For example, if about 30 angstroms are grown on low voltage device 90, only about 20 angstroms of oxide may be grown on high voltage device 100.

Figure 18:
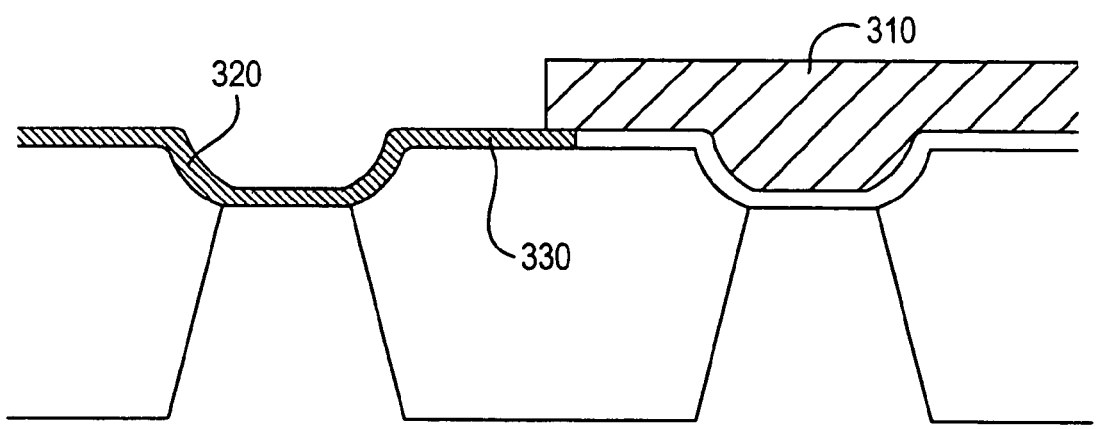
FIG. 18 illustrates a portion of a dielectric layer unintentionally covered by a mask.
Figure 19:
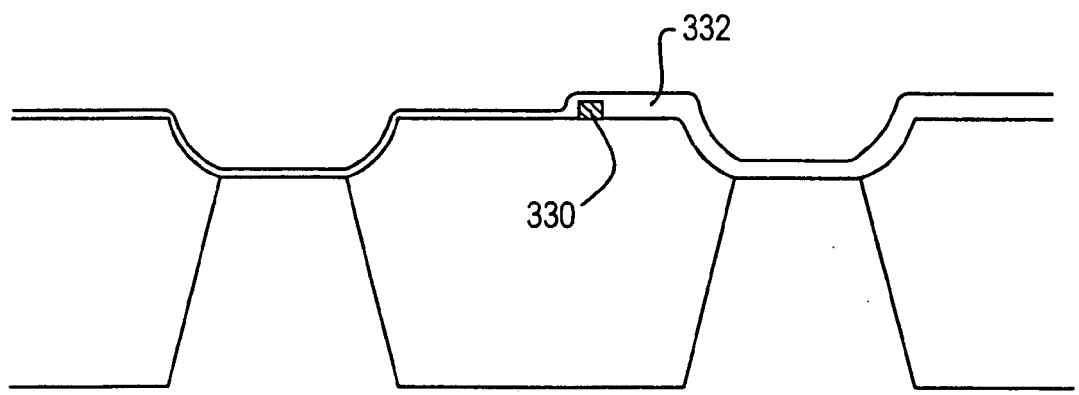
FIG. 19 illustrates a hedge that may result from a portion of a dielectric layer unintentionally covered by a mask.

During the fabrication of peripheral devices, masks may not line up exactly with the oxide layers or dielectric layers that they are intended to cover. At times, a mask may unintentionally cover a small portion of a dielectric layer. This is illustrated in FIG. 18. As shown, mask 310 covers a portion of dielectric layer 320. Portion 330 will not be removed when the rest of dielectric layer 320 is removed, and as shown in FIG. 19, portion 330 may remain on the peripheral device and have oxide 332 grown over it.

Portions such as portion 330 are sometimes referred to as hedges. Hedges are often undesirable because they may lift off in subsequent fabrication processing, unpredictably disrupting the grown oxide layer. Hedges may be controllably removed by exposing trenches in the field oxide under the hedges. To expose a trench in the field oxide, a mask may be deposited on or placed over a device. The mask may have openings that line up with desired trench locations (i.e., where the hedges are located). The field oxide is exposed at those openings, and the mask is then removed.

Figure 20:
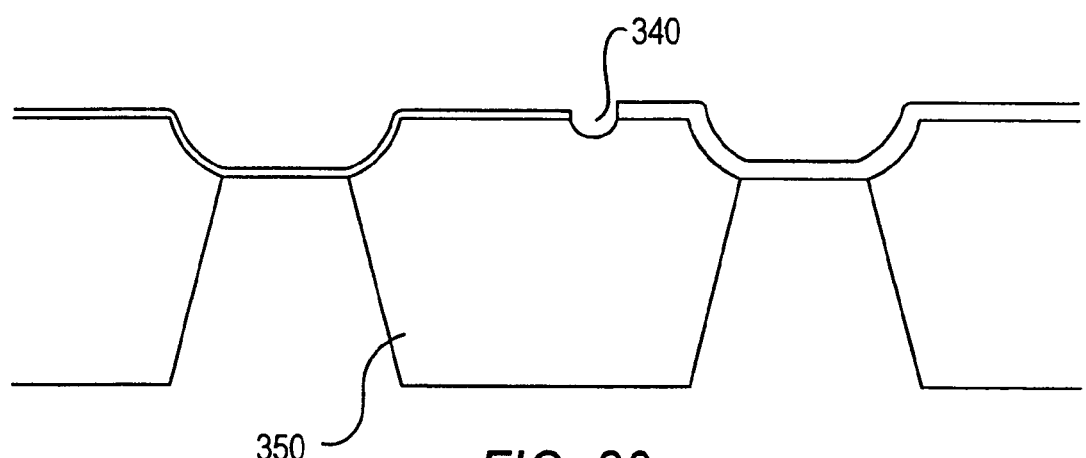
FIG. 20 illustrates hedge removal by exposing a trench in a field oxide in accordance with the invention.

As illustrated in FIG. 20, a trench 340 was exposed in field oxide 350 causing portion 330 (i.e., a hedge) to be removed. Hedges may be alternatively removed using any suitable method or technique. (FIGS. 18-20 are not drawn to scale.)

Figure 21:
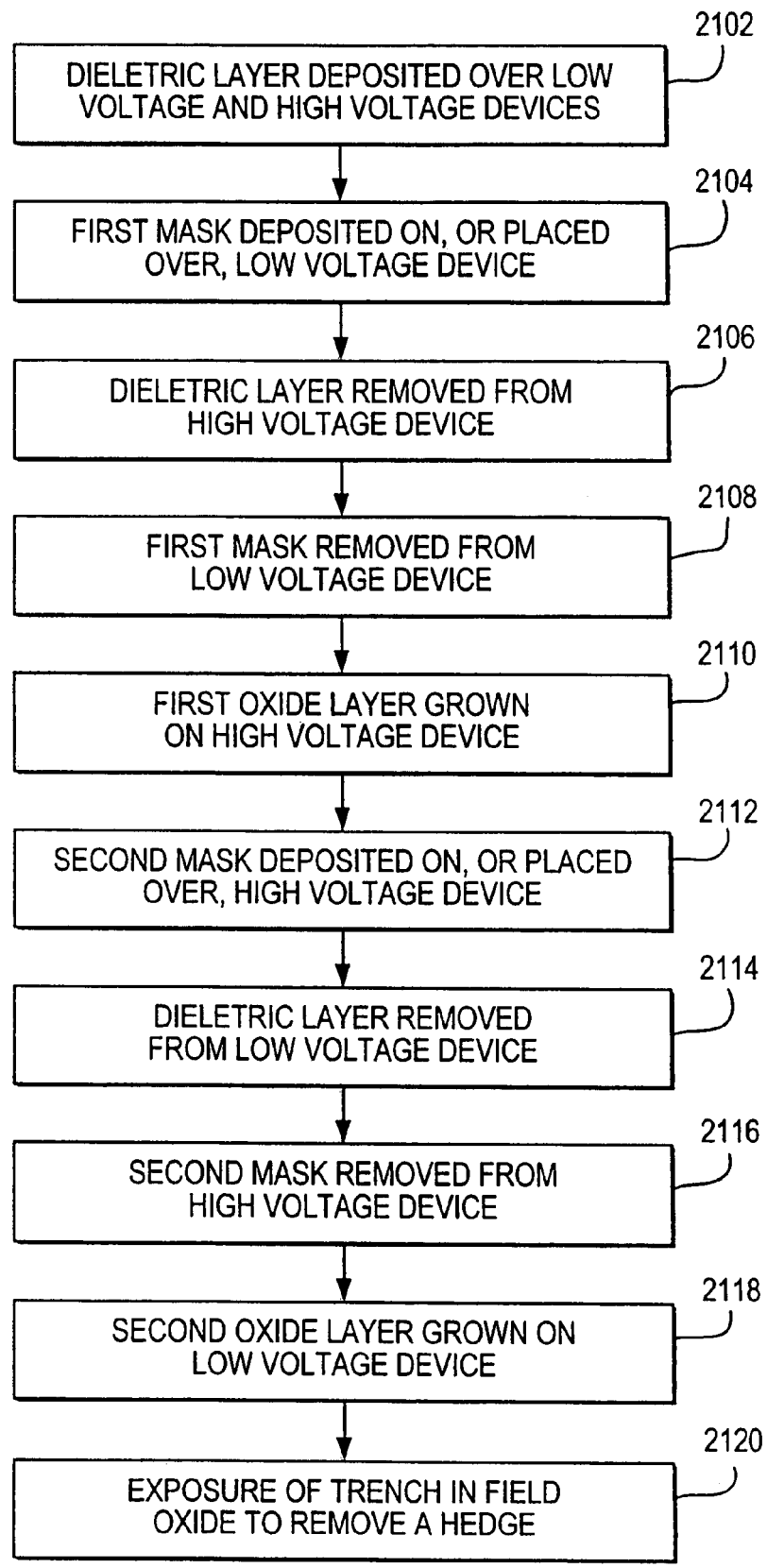
FIG. 21 is a flow chart of the fabrication process illustrated in FIGS. 8-20 and 22.

The fabrication process illustrated in FIGS. 8-17 and 20 is depicted in the flow chart of FIG. 21. At step 2102, a dielectric layer is deposited over the low voltage and high voltage devices. At step 2104, a first mask is then deposited on or placed over the low voltage device. Then, at step 2106, the dielectric layer is removed from the high voltage device. The first mask is then removed from the low voltage device and a first oxide layer is grown on the high voltage device (steps 2108 and 2110).

Subsequently, a second mask may be deposited on or placed over the high voltage device (step 2112). The dielectric layer is then removed from the low voltage device at step 2114. Then, the second mask is removed from the high voltage device and a second oxide layer is grown on the low voltage device (steps 2116 and 2118). Any hedges that result from this process may be removed by exposing a trench in the field oxide at step 2120.

Figure 22:
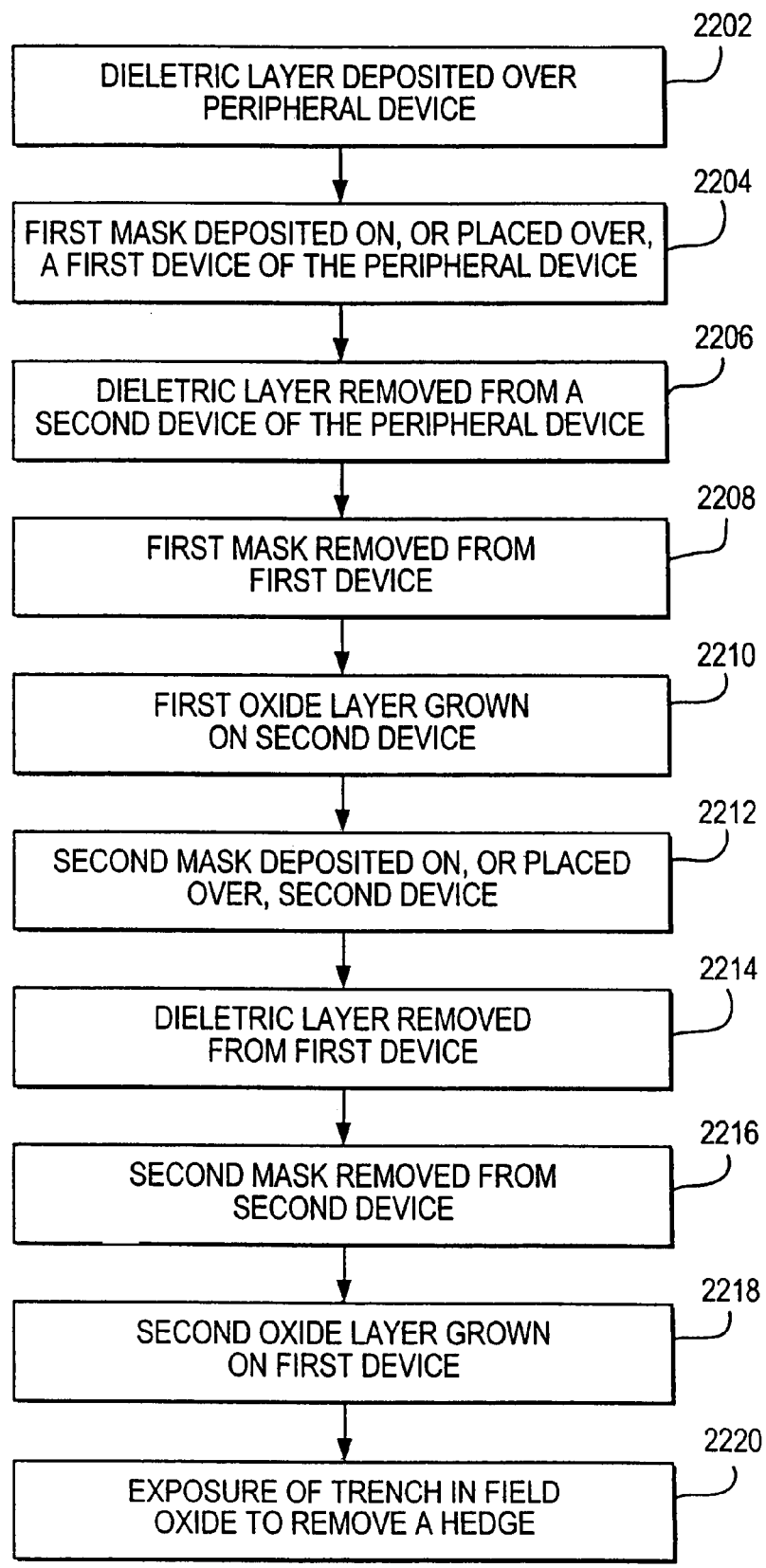
FIG. 22 is a flow chart of another embodiment of a fabrication process that reduces gate oxide thinning at field edges in accordance with the invention.

FIG. 22 depicts another embodiment of a process that reduces gate oxide thinning at field edges in accordance with the invention. At step 2202, a dielectric layer is deposited over a peripheral device. The peripheral device includes a first device and a second device (e.g., a low voltage device and a high voltage device, MOS devices in parallel, and various other CMOS devices; capacitors, field effect transistors). At step 2204, a first mask is deposited on or placed over the first device of the peripheral device to protect the dielectric from being removed from the first device. At step 2206, the dielectric not protected by the mask is removed. This exposes the second device of the peripheral device. That is, the second device is no longer protected by the dielectric.

The first mask is then removed from the first device and a first oxide layer is grown on the second device (steps 2208 and 2210). A second mask is then deposited on or placed over the second device (step 2212). The dielectric layer is then removed from the first device at step 2214. Then, the second mask is removed from the second device and a second oxide layer is grown on the first device (steps 2216 and 2218). Any hedges that result from this fabrication process may be removed by exposing a trench in the field oxide at step 2220.

Thus it is seen that fabrication processes for reducing field edge thinning in peripheral devices are provided. One skilled in the art will appreciate that the invention can be practiced by other than the described embodiments, which are presented for purposes of illustration and not of limitation, and the invention is limited only by the claims which follow.

We claim:

1. A method of fabricating a peripheral memory device comprising a low voltage device and a high voltage device portions of a substrate of the peripheral device, wherein the low voltage and high voltage device portions are separated by an insulation barrier, the method comprising:
   depositing on the peripheral device a dielectric, the dielectric comprising a nitride material and an oxide material, wherein the oxide material is in physical contact with the substrate of the peripheral device and with a top surface of the insulation barrier, and the oxide material separates the substrate of the peripheral device and the top surface of the insulation barrier from the nitride material;
   overlaying the low voltage device portion with a first mask;
   after said overlaying the device portion with the first mask, removing, from areas not overlaid with the first mask, a first portion of the dielectric covering a first portion of the insulation barrier to expose a top surface of the high voltage device portion of the substrate;
   after said removing of said first portion, removing the first mask;
   growing a first oxide on the high voltage device portion;
   overlaying the high voltage device portion with a second mask;
   after said overlaying the device portion with the second mask, removing, from areas not overlaid with the second mask, a second portion of the dielectric covering a second portion of the insulation barrier to expose a top surface of the low voltage device portion of the substrate;
   after said removing of said second portion, removing the second mask; and
   growing a second oxide on the low and high voltage device portions.

2. The method of claim 1 wherein the dielectric comprises oxide-nitride-oxide.

3. The method of claim 1 wherein the dielectric is about 150 angstroms thick.

4. The method of claim 1 wherein the insulation barrier comprises silicon dioxide.

5. The method of claim 4 further comprising exposing a trench in the silicon dioxide to remove a hedge.

6. The method of claim 1 wherein the insulation barrier comprises an isolation dielectric.

7. The method of claim 1 wherein the dielectric is substantially uniform in thickness across the peripheral device.

8. The method of claim 1 wherein the first and second portions of the dielectric are removed without a wet etch process.

9. The method of claim 1 wherein the dielectric further comprises wet oxide etch barrier material.

10. A method of fabricating metal oxide semiconductor devices in parallel, the metal oxide semiconductor devices comprising a low voltage semiconductor device portion of a substrate of the semiconductor devices and a high voltage semiconductor device portion of a substrate of the semiconductor devices, wherein the low voltage and high voltage portions are separated by an insulation barrier, the method comprising:

depositing on the semiconductor devices a dielectric, the dielectric comprising a nitride material and an oxide material, wherein the oxide material is in physical contact with the substrate of the semiconductor devices and with a top surface of the insulation barrier, and the oxide material separates the substrate of the semiconductor devices and the top surface of the insulation barrier from the nitride material;

overlaying the low voltage semiconductor device portion with a first mask;

after said overlaying the device portion with the first mask, removing, from the high voltage semiconductor device portion where the first mask is not overlaid, a first portion of the dielectric covering a first portion of the insulation barrier to expose a top surface of the high voltage semiconductor device portion of the substrate;

after said removing of said first portion, removing the first mask;

growing a first oxide on the high voltage semiconductor device portion;

overlaying the high voltage semiconductor device portion with a second mask;

after said overlaying the device portion with the second mask, removing, from the low voltage semiconductor device portion where the second mask is not overlaid, a second portion of the dielectric covering a second portion of the insulation barrier to expose a top surface of the low voltage semiconductor device portion of the substrate;

after said removing of said second portion, removing the second mask; and growing a second oxide on the low voltage semiconductor device portion and the high voltage semiconductor device portion.

11. The method of claim 10 wherein the low voltage semiconductor device portion comprises a field effect transistor.

12. The method of claim 10 wherein the high voltage semiconductor device portion comprises a field effect transistor.

13. The method of claim 10 wherein the low voltage semiconductor device portion comprises a capacitor.

14. The method of claim 10 wherein the high voltage semiconductor device portion comprises a capacitor.

15. The method of claim 10 wherein the insulation barrier comprises an isolation dielectric.

16. The method of claim 10 wherein the dielectric comprises oxide-nitride-oxide.

17. The method of claim 10 wherein the dielectric is about 150 angstroms thick.

18. The method of claim 10 wherein the insulation barrier comprises silicon dioxide.

19. The method of claim 10 wherein the dielectric is substantially uniform in thickness across the semiconductor devices.

20. The method of claim 10 wherein the first and second portions of the dielectric are removed without a wet etch process.

21. The method of claim 10 wherein the dielectric further comprises wet oxide etch barrier material.

22. A method of fabricating a device comprising first and second device portions of a substrate of the device, wherein the first and second device portions are separated by an insulation barrier, the method comprising:

providing a dielectric on the device;

overlaying the first device portion with a mask;

removing, from areas not overlaid with the mask, a portion of the dielectric covering the second device portion;

removing the mask;

growing an oxide on the second device portion; and exposing a trench in the insulation barrier to remove a hedge.

* * * * *